United States Patent [19]

Wagal et al.

[11] Patent Number: 4,987,007

[45] Date of Patent: Jan. 22, 1991

[54] METHOD AND APPARATUS FOR PRODUCING A LAYER OF MATERIAL FROM A LASER ION SOURCE

[75] Inventors: Suhas S. Wagal; Carl B. Collins, both of Richardson, Tex.

[73] Assignee: Board of Regents, The University of Texas System, Austin, Tex.

[21] Appl. No.: 183,022

[22] Filed: Apr. 18, 1988

[51] Int. Cl.⁵ .................... B05D 3/06; C23C 16/48
[52] U.S. Cl. .................... 427/53.1; 427/38; 427/42; 427/43.1; 118/50.1; 118/723
[58] Field of Search ............ 427/38, 42, 43.1, 53.1, 427/122, 250; 118/722, 723, 50.1; 250/423 P, 492.2; 204/192.1, 192.11, 298 BD, 298.04

[56] References Cited

U.S. PATENT DOCUMENTS

| | | | |
|---|---|---|---|
| 3,406,349 | 10/1968 | Swain et al. | 250/423 P X |
| 4,281,030 | 7/1981 | Silfvast | 427/53.1 X |
| 4,370,176 | 1/1983 | Bruel | 250/492.21 X |
| 4,664,769 | 5/1987 | Cuomo et al. | 250/423 P X |
| 4,664,940 | 5/1987 | Bensoussan et al. | 427/53.1 |
| 4,701,592 | 10/1987 | Cheung | 219/121.77 |

FOREIGN PATENT DOCUMENTS 2155042A 9/1985 United Kingdom .

OTHER PUBLICATIONS

Sato et al., Diamond-Like Carbon Films Prepared by Pulsed-Laser Evaporation, Appl. Phys. A 35, 355-360 (1985).
Nagel et al., *Deposition of Amorphous Carbon Films from Laser-Produced Plasmas,* Mat. Res. Soc. Symp. Proce., vol. 38 (1985), Materials Research Society.
Sato et al., Deposition of Diamond-Like Carbon Films by Pulsed-Laser Evaporation, Japanese Journal of Applied Physics, vol. 26, No. 9, Sep. 1987, pp. L1487-L1488.
Cheung et al., Growth of Thin Films by Laser-Induced Evaporation, Critical Review of Solid State and Materials Seiences, vol. 15, Issue 1 (1988).
Mirtich et al., "Diamondlike Carbon Protective Coatings for IR Materials", National Aeronautics and Space Administration.
Angus et al., "Low-Pressure, Metastable Growth of Diamond and Diamondlike Phases", Science, vol. 241 (Aug. 19, 1988).
Richter et al., "About the Structure and Bonding of Laser Generated Carbon Films by Raman and Electron Energy Loss Spectroscopy", Journal of Non-Crystalline Solids 88 (1986), 131-144.
Kitahama et al., "Synthesis of Diamond by Laser-Induced Chemical Vapor Deposition", Appl. Phys, Lett 49 (11), Sep. 15, 1986.
Messier et al., "From Diamond-Like Carbon to Diamond Coatings", Thin Solid Films, 153 (1987), 1-9.
Kitabatake et al., "Growth of Diamond at Room Temperature by an Ion-Beam Sputter Deposition under Hydrogen-Ion Bombardment", J. Appl. Phys. 58(4), Aug. 15, 1985.
Sato et al., "Deposition of Diamond-Like Carbon Films by Pulsed-Laser Evaporation", (1987).

*Primary Examiner*—Nam X. Nguyen
*Attorney, Agent, or Firm*—Arnold, White & Durkee

[57] ABSTRACT

A method and apparatus is provided which produces a layer of material on a substrate by extracting ions from a laser ablation plume in a vacuum environment. In a basic embodiment, the apparatus includes a vacuum chamber containing a target material and a laser focused on the target to ablate the material and ionize a portion of the ablation plume. An accelerating grid within the vacuum chamber is charged to extract the ions from the plume and direct the ions onto a substrate to grow the layer. The basic embodiment has produced diamond-like carbon films on a clean, unseeded silicon substrate at deposition rates approaching 20 microns per hour. The diamond-like carbon films produced were of exceptional quality: uniform thickness with a surface roughness about 1 Angstrom; uniform index of refraction within the range of 1.5-2.5; resistivity greater than 40 megs ohms per centimeter; and a hard surface resistant to physical abuse. An enhanced embodiment includes multiple targets within the vacuum chamber and mechanisms to selectively produce ions from each target. Thus, layers of different materials or doped materials can be made on the substrate. Additionally, the enhanced embodiment includes a mechanism for making patterns or circuits within each layer. One version incorporates a mask within the ion fluence and ion optics to magnify the mask pattern onto the substrate. Another version uses ion optics to form an ion beam and deflection plates controlling the ion beam to write the desired pattern on the substrate.

63 Claims, 2 Drawing Sheets

METHOD AND APPARATUS FOR PRODUCING A LAYER OF MATERIAL FROM A LASER ION SOURCE

The Government may own certain rights to this invention. The invention may have been supported in part by a supporting contract with the Naval Research Laboratories, Contract No. N00014-86-C-248.

BACKGROUND OF THE INVENTION

1. Field of the Invention

This invention relates to a method and apparatus which produces a layer of material on a substrate by extracting ions from a laser ablation plume in a vacuum environment. In one embodiment, the invention relates to a method for producing diamond-like carbon films of nearly uniform thickness, surface smoothness approaching one angstrom, and a uniform index refraction approaching pure diamond (about 2.4).

2. Description of the Related Art

In recent years, there has been great interest in producing diamond-like carbon coatings for a variety of reasons. First, diamond-like carbon is an extremely hard surface nearly impervious to physical abuse (abrasive or chemical) and is therefore quite useful as a protective surface. Diamond-like carbon is optically transparent (in e.g., the infrared spectrum), and is therefore believed to be useful in a variety of optics applications such as protecting sensor optics optical circuits, quantum wells, etc. In addition, diamond-like carbon has been found to have a high electrical resistance as well as high thermal conductivity—an unusual combination. Thus, it is postulated that diamond-like carbon films would be quite useful in the electronics industry as a protective, resistive coating with extremely desirable heat sink properties. Diamond-like carbon when doped, can act as a semiconductor itself, forming the basis of technology for microcircuitry which can operate under high hostile conditions of high temperatures and radiation levels. Therefore, there has been great interest in developing techniques for obtaining diamond-like carbon films in commercial quantities for possible use in the semiconductor industry.

Currently, there are four major methods being investigated for producing diamond-like carbon films: (1) ion beam deposition; (2) chemical vapor deposition; (3) plasma enhanced chemical vapor depositions; and (4) sputter deposition. The ion beam deposition method typically involves producing carbon ions by heating a filament and accelerating carbon ions to selected energies for deposit on a substrate or high vacuum environment. Ion beam systems use differential pumping and mass separation techniques to reduce the level of impurities in the carbon ion fluence a rowing film. While acceptable films of diamond-like carbon can be obtained, the films are expensive to produce and are only achievable at very slow rates of growth on the order of 50 angstroms per day.

The chemical vapor deposition and plasma enhanced chemical vapor deposition methods are similar in operation and associated problems. Both methods use the dissociation of organic vapors such as $CH_3OH$, $C_2H_2$, and $CH_3OHCH_3$ to produce both carbon ions and neutral atoms of carbon for deposit on a substrate. Unfortunately, the collateral products of dissociation frequently contaminate the growing film. While both chemical vapor deposition and plasma enhanced chemical vapor deposition achieve film growth rates of practical levels, such films are of poor optical quality and unsuitable for most commercial uses.

Sputtering deposition usually includes two ion sources, one for sputtering carbon from a graphite source onto a substrate, and another ion source for breaking the unwanted graphite bonds in the growing film. For example, an argon ion sputtering gun sputters pure carbon atoms off of a graphite target within a vacuum chamber, and the carbon atoms are condensed onto a substrate. At the same time, another argon ion source cobombards the substrate to enhance the breakdown of the graphite bonding in favor of a diamond-like or tetrahedral bond in the growing carbon film. The high vacuum pressure ($10^{-5}$ to $10^{-4}$ torr) in sputtering deposition is cumbersome and tends to introduce contamination of the film on a level comparable to those encountered in chemical vapor deposition and plasma enhanced chemical vapor deposition.

Therefore, while many attempts have been made to obtain high quality diamond-like carbon at commercial levels of production, the results have thus far been disappointing. The known methods recited above are deficient in many respects. While the ion beam deposition method produces acceptable quality film, its slow growth rates are impractical. The chemical vapor deposition and sputter methods are prone to contamination yielding an unacceptable film in most circumstances. All known methods require elevated temperatures, which often prove impractical if coating an optical substrate is desired. The known methods all involve complex and cumbersome devices to implement.

Producing diamond-like carbon is just one example of the general problem of producing a layer of material having desirable physical properties where the material is extremely difficult to handle or manipulate. Examples of other such materials include semiconductors, such as silicon, germanium, gallium arsenide, and recently discovered superconducting materials which might be generally characterized as difficult to handle ceramics (e.g., yttrium-barrium compounds). Therefore, it would be a significant advance to achieve a method and apparatus which could produce a high quality diamond-like carbon layer in commercial quantities. Further, it would be significant if such method and apparatus were useful in producing layers of other types of materials which using conventional technology are difficult to handle or produce.

SUMMARY OF THE INVENTION

The present invention represents a major breakthrough in its ability to produce high quality diamond-like carbon layers and in its ability to produce other materials which conventionally have been extremely difficult to produce or handle. Diamond-like carbon layers produced in accordance with the present invention have extremely desirable properties such as physical hardness, electrical strength, high thermal conductivity, and optical transparency. For example, diamond-like carbon layers made in accordance with the present invention have exhibited uniform thickness with less than 3% variation, a surface smoothness of about plus or minus one angstrom, resistivity exceeding 40 mega ohms per centimeter, and a uniform refractive index of approaching 2.5. Such diamond-like carbon layers have been produced at high growth rates exceeding 20 microns per hour over large areas (e.g., 10 square centimeters). Diamond-like carbon layers produced in accordance with the present invention are made at room temperature—permitting coating of optical substrates without damage. Further, the present invention has been useful in producing layers of other difficult to produce or handle materials, leading to the possibility of doping diamond-like carbon layers, producing alternating layers of hard to produce materials on a substrate, or producing layers of material on a substrate which have been traditionally difficult or impossible to produce.

Broadly speaking, the apparatus in accordance with the present invention includes a vacuum chamber, a target positioned within the chamber, and a laser directed and focused on the target. It is believed that this laser ablation of the target ejects target material in a plume with the laser beam partially ionizing the plume. A separation mechanism is positioned within the chamber and charged at an electrical potential for extracting the ions from the region of the plume and propelling the ions along an ion path of travel within the chamber. A substrate is disposed within the chamber along the ion path of travel to collect the ions to produce the layer of material. For producing diamond-like carbon, an essentially pure graphite target is used with the laser ablation ejecting a plume of carbon vapor and ionizing a portion of the plume to create the carbon ions. The separation mechanism comprises an accelerating grid spaced from the graphite target and charged at a negative potential (200–2000 volts) for separating the carbon ions from the plume.

The method of producing a layer of material in accordance with the present invention broadly comprises the steps of positioning a target substance in the chamber, creating a vacuum within the chamber, and directing and focusing the laser beam on the target. The method further involves the steps of ablating a portion of the target with the laser beam to eject a plume of the target substance, ionizing part of the plume with the laser beam to create ions in the region of the plume, moving at least some of the ions from the region of the plume towards a charged potential within the chamber, and positioning a substrate to collect the ions to form a layer of material on the substrate. For producing diamond-like carbon, the target material comprises graphite, the ions are carbon ions, and a high voltage negatively charged potential is spaced from the target to separate the ions away from the target. The diamond-like carbon product produced by such a process can attain a generally uniform thickness of less than about 3% variation and a surface roughness less than about 10 angstroms. Preferably, the diamond-like carbon product produced by such process has an index of refraction exceeding about 2.0 and a resistivity greater than about 40 mega ohms per centimeter.

In an enhanced apparatus of the present invention, first and second targets are positioned within the vacuum chamber and a mechanism is included for selectively directing a laser beam at each target to eject a plume of material and ionize at least a portion of the material. In one version, the directing means includes a beam splitter and appropriate mirrors for splitting the laser beam into two beams directed at each target respectively. Further, the directing means may optionally include an iris disposed in the path of travel of each laser beam and controllable to selectively lase each target. Of course, the enhanced version may alternatively include two lasers, one for each target for selectively ablating each target. In still another variation, an accelerating grid chargeable at negative potential is positioned adjacent each target and an electronic shutter arrangement coupled to the grids to selectively separate ions from each target and direct the ions towards the substrate. Thus, the enhanced embodiment can be operated to simultaneously ionize a material from each target and direct a fluence of mixed ions towards the substrate. Alternatively, the enhanced embodiment can operate to direct sequential layers of different material onto the substrate.

In a preferred method using the enhanced apparatus, one of the target materials comprises nearly pure graphite for producing a diamond-like carbon layer on the substrate. The second target comprises a doping material such as boron or phosphorous for producing doped layers of diamond-like carbon or alternating layers of diamond-like carbon and dopant. For example, doped strata of diamond-like carbon can be formed (n-p-n junctions) to form semiconducting diamond-like carbon. It will be appreciated that the enhanced apparatus and method are useful for producing layers of many different types of materials.

In a particularly preferred form, the enhanced apparatus includes ion optics positioned between the targets and substrate for manipulating the impingement of the ions on the substrate. For example, such ion optics may comprise a mask to prevent some of the ions from reaching the substrate to produce a desired pattern of material on the substrate. Further, the ion optics might include a magnification mechanism between the mask and substrate for reducing the size of the ion fluence to produce a small pattern on the substrate. Optionally, the ion optics might include a mechanism for magnifying the ion fluence into an ion beam, and deflection plates to deflect the ion beam into a desired pattern on the substrate. It can be appreciated that such ion optics may be particularly useful in a wide variety of applications such as producing quantum wells, optical circuits, or small quantities of custom integrated circuits.

In the present application, the term "layer" has generally been used synonymously with coating or film, and connotes material deposited or grown on a substrate. However, it should be understood that the substrate is not necessarily a different material than the layer, but merely serves as a collection source for ions. Thus, the substrate might comprise diamond or diamond-like carbon on which a layer of diamond-like carbon is received to produce a homogeneous part of uniform physical properties.

In the present application "diamond-like carbon" has been used as a generic term for a material having some of the physical characteristics of diamond. In view of the physical properties of the materials produced in accordance with the present invention, the layer might alternatively be called diamond or amorphic diamond. The term "diamond-like carbon" generally includes carbon materials having both amorphous and microcrystalline atomic structures and containing anywhere from 0 to 40% hydrogen concentration. Thus, the use of the term "diamond-like carbon," should not be understood to indicate a specific type of structure (e.g., amorphous, microcrystalline, large-grain polycrystalline, or single crystal) or specific type of composition, such as percentage of hydrogen or other impurities in interstitial sites in grain boundaries. Specific structural or compositional characteristics are specifically stated.

DESCRIPTION OF THE PREFERRED EMBODIMENTS

1. Embodiment of FIGS. 1-3

Figure 1:
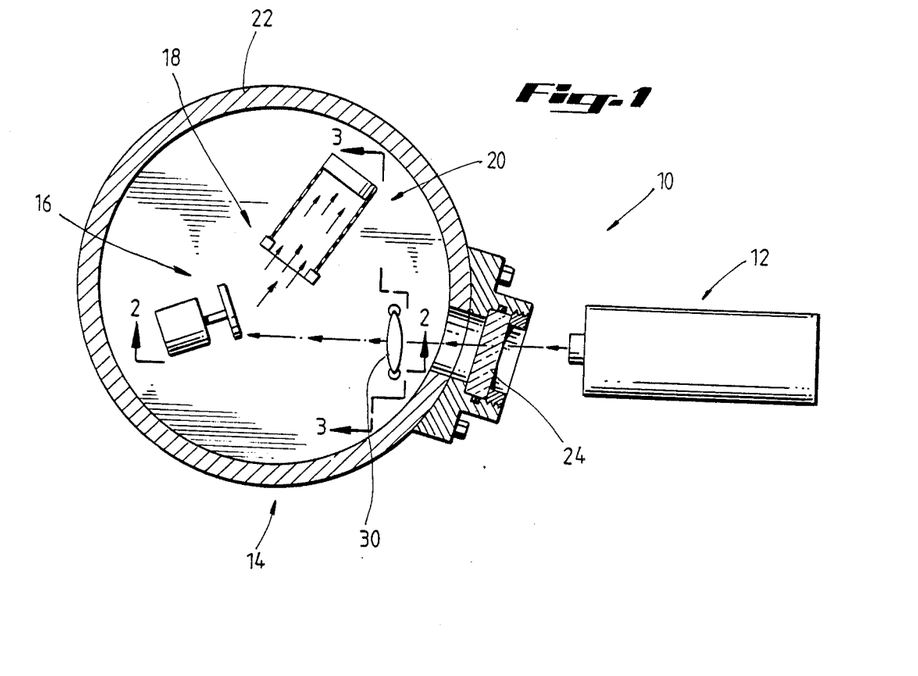
FIG. 1 is a top plan view in partial horizontal section illustrating the basic apparatus in accordance with the present invention.
Figure 2:
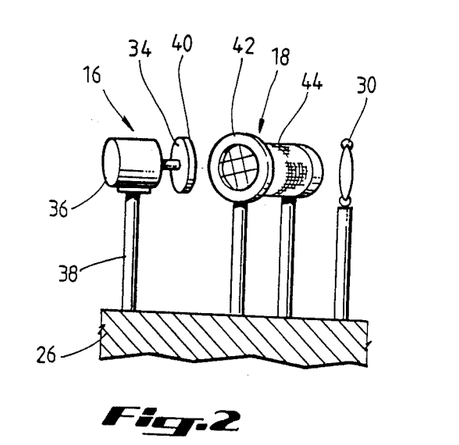
FIG. 2 is a fragmentary, side elevational view in partial section taken along line 2—2 of FIG. 1.
Figure 3:
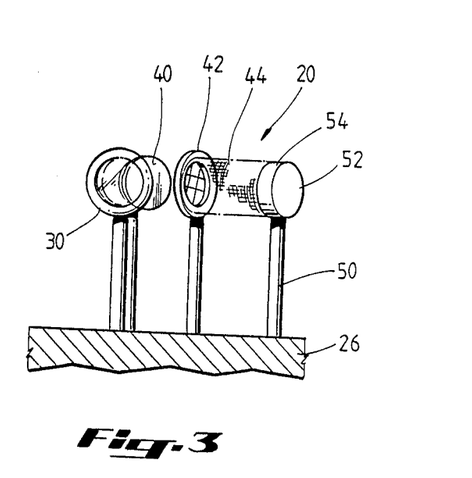
FIG. 3 is a fragmentary, side elevational view in partial section taken along line 3—3 of FIG. 1.

Turning to FIGS. 1-3, the basic embodiment of the apparatus 10 in accordance with the present invention is illustrated. Broadly speaking, the apparatus includes a laser 12, a vacuum chamber 14, a target assembly 16, a separation mechanism 18, and a substrate assembly 20. The laser 12 in FIG. 1 is a neodymium-glass laser which can be operated in either a triggered mode or a Q-switched mode. In the triggered mode, the laser 12 gives about 10 Joules of energy in a 10 microsecond pulse, while in the Q-switched mode, the laser 12 produces nominally one Joule of energy in a 10 nanosecond pulse. Preferably, the Q-switched mode is utilized because of the higher power density obtainable. It being believed that a power density in excess of $1 \times 10^6$ watts per square centimeter is preferred in the present invention, which of course is obtainable in the Q-switch mode. It is believed that any sharp pulse laser having sufficient power density would be operable in accordance with the present invention (e.g., XeF, KrF, or ArF lasers). It is believed to be preferable to use a laser having the greatest power density obtainable focused on the target.

The vacuum chamber 14 preferably obtains about $2 \times 10^{-6}$ torr working environment. The vacuum chamber 14 includes a bell-shaped housing 22 having a quartz window 24 sealingly positioned in the outer surface as shown in FIG. 1. The bell-shaped housing 22 can be raised or lowered to sealingly mate with a plate table 26 (FIGS. 2-3) to provide access to the interior of the housing 22.

As can be seen in FIG. 1, a focusing lens 30 is disposed along the laser beam path of travel for focusing the laser beam. The lens 30 illustrated has a focal length of about 12 centimeters, and because of the relative dimensions of the chamber 14 is positioned within the chamber 14.

The target assembly 16 includes a target support 34 mounted to the shaft of motor 36. The motor 36 is mounted to the top of post 38, which in turn runs perpendicularly upward from the table 26. In the embodiment illustrated in FIGS. 1-3, a target 40 of highly purified graphite (99.999%) is mounted to the target support 34.

The separation mechanism 18 comprises an accelerating grid 42 having a plurality of coplanar wires, with the grid 42 spaced about 4 centimeters from the target 40. In the illustrated embodiment, the accelerating grid 42 is chargeable at a high negative potential through conductors (not shown) at about 200-2000 volt. A Faraday cage 44 extends from the accelerating grid 42 to the region of the substrate assembly 20 to isolate the drift space between the accelerating grid and substrate assembly 20 from stray fields (such as from the conductors connected to the grid 42).

The substrate assembly 20 includes a mounting pedestal 50 extending upwardly perpendicular from the table 26. A substrate bracket 52 is coupled to the top of the pedestal 50, a substrate 54 coupled to the bracket 52. In the preferred embodiment, the substrate 54 comprises a silicon (111) disk 7.5 centimeters in diameter coupled to the bracket 52. In the drawing, the substrate 54 is positioned approximately 15 centimeters from the surface of the target 40. An ion fluence path of travel is generally defined from the target 40 through the accelerating grid 42 and Faraday cage 44 to the substrate 54 (FIG. 1).

In operation, the embodiment of FIGS. 1-3 can produce high quality diamond-like carbon at relatively high deposition rates while operating at room temperature. The substrate 54 does not require any seeding with debris or abrasive treatment with either diamond or other particles. Because operation is at room temperature, diamond-like carbon can be applied to optical substrates without damage to the substrate. After positioning the target 40 and substrate 54, the chamber 14 is evacuated to about $2 \times 10^{-6}$ torr. The laser 12 is operated in the Q-switched mode, which is pulsed for 10 nanosecond periods. The laser beam is focused through the lens 30 to produce a power density at the surface of the target 40 of about $1 \times 10^6$ watts per square centimeter. Without being bound by theory, it is believed that the effect of the laser beam is to eject a plume of carbon vapor from the graphite target. The focused beam is believed to ionize a portion of the plume to produce carbon ions. The neutral carbon atoms expand isotropically, with the high vacuum environment within the chamber 14 rapidly attenuating the flux of neutrals around the region of the plume. Thus, expansion of the carbon neutral atoms to the region of the substrate 54 is minimal, almost eliminating contamination.

The accelerating grid 42 is negatively charged to a potential of about 1000 volts (range 200-2000 volts), while the target assembly 16 is grounded. This high negative potential draws the carbon ions from the region of the plume and linerally accelerates the ions on the ion fluence path through the grid 42 to the substrate 54. The Faraday cage 44 isolates stray fields to prevent inadvertent deflection of ions from the target 40 to the substrate 54.

Although the duty cycle of the laser 12 is relatively low, the apparatus 10 can achieve growth rates of diamond-like carbon reaching 20 microns per hour. It is believed that higher power density of the laser focused on the graphite target 40 will achieve even higher growth rates. Diamond-like carbon layers produced are mirror smooth and uniform, producing no perceptible distortion or reflective images in test patterns. Raman spectra indicates diamond-like carbon having a triangular structure peaking at 1560 cm$^{-1}$ with a base stretching from 1000 cm$^{-1}$ to 1600 cm$^{-1}$. The uniform thickness of the diamond-like carbon layer is surprising, having less than about 3% variation in thickness. One sample having a relative uniform thickness of about 180 angstrom had a surface roughness of about plus or minus 1 angstrom. The diamond-like carbon layers demonstrated a nearly uniform index of refraction within the range of 1.5-2.4, approaching index of refraction for diamond. Resistance measured on the surface of the diamond-like carbon layer typically exceeds 40 mega ohms per centimeter. Layers annealed at 600° centigrade show a surface resistance less than 500 ohm per centimeter. After the diamond-like carbon layers were immersed in boiling water for one hour and 10% HC1 solution for ½ hour they remained intact.

It is believed that operating the laser to ablate a particular location on the target 40 for multiple cycles is desirable. The laser ablation creating and ejecting the plume of carbon vapor tends to create a cavity in the target 40, confining the plasma plume and enhancing the ionization of the plume by the impinging laser. After several repetitions, the depth of the cavity becomes more pronounced and remote from the focal length of the laser spot, resulting in less efficient power density. At this stage, it is believed desirable to operate the motor 36 to rotate the target 40 to present a new surface of the graphite target to the laser 12 for ablation.

It is believed that the uniform optical quality and physical characteristics of the diamond-like carbon layers grown by the apparatus 10 result in part from the high proportion of carbon ions to neutrals in the plasma plume formed by the laser ablation. It is also believed that free electrons trail with the carbon ions in their transit through the accelerating grid 42 to the substrate 54. This may in part explain the high growth rate of diamond-like carbon layers (20 microns per hour) at a quality almost free of contamination, which far surpasses any results thus far obtained from ion beam, of vapor deposition, or sputter deposition methods.

2. Embodiment of FIGS. 4-5

Figure 4:
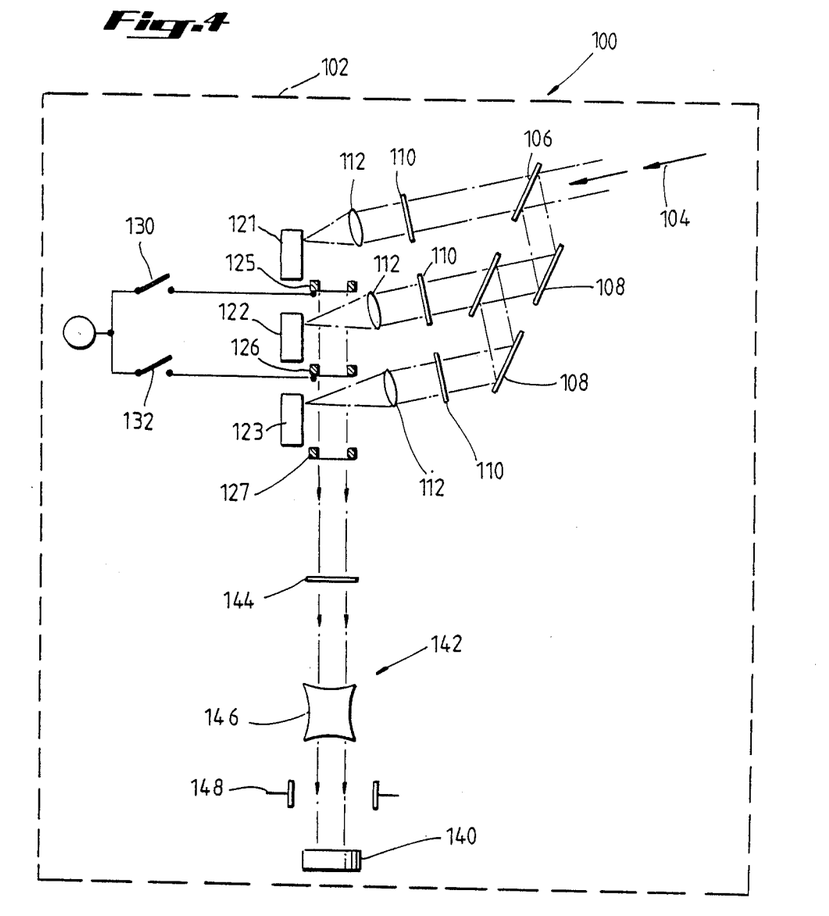
FIG. 4 is a schematic illustration of the enhanced embodiment of the present invention.
Figure 5:
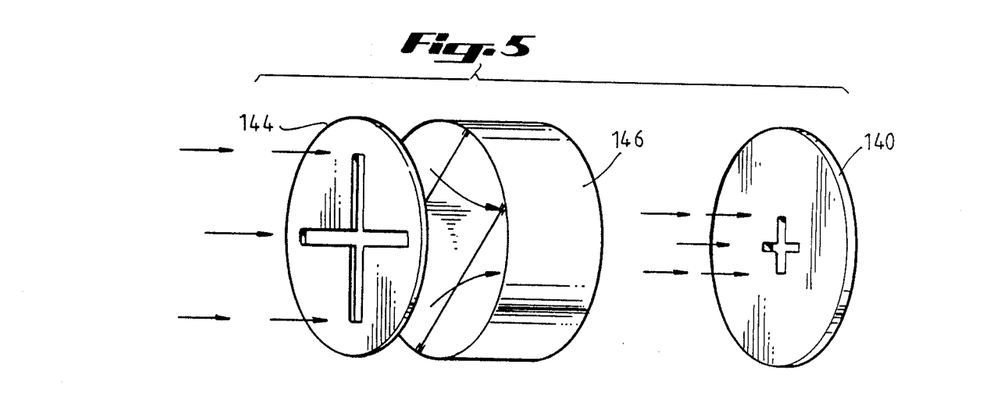
FIG. 5 is an enlarged perspective view of an embodiment of the ion optics of FIG. 4.

Turning to FIGS. 4-5, an enhanced embodiment 100 of an apparatus in accordance with the present invention is illustrated. An ultra high vacuum ($2 \times 10^{-6}$ torr) chamber 102 is encompassing, with a laser beam 104 directed into the chamber 102 (the laser is not shown). A pair of beam splitters 106 are disposed in the path of the laser beam 104, which in conjunction with mirrors 108 produce three distinct, parallel laser beams. Of course, three separate lasers could be incorporated to produce the three separate laser beams to eliminate the beam splitter and mirror arrangement.

Irises 110 are disposed in the paths of the laser beams prior to three lenses 112 to control the amount of laser energy respectively reaching the lenses 112. The lenses 112 respectively focus the three laser beams on respective targets 121, 122, and 123. In the illustrated embodiment, the target 123 is nearly pure graphite, while targets 121 and 122 are dopants, i.e., boran and phosphorous. As can be seen in FIG. 4, accelerating grids 125, 126, and 127 are disposed adjacent the respective targets 121-123 in general alignment. Electronic shutters 130, 132 control the negative voltage applied to the respective accelerating grids 125, 126, it being understood that such an electronic shutter may be applied to the grid 127 as well.

As shown in FIG. 4, the accelerating grids 125-127 are in alignment to define an ion fluence path of travel to the substrate 140. Between the grid 127 and substrate 140 ion optics 142 are introduced for manipulating the ion fluence. In FIG. 4, the ion optics include a mask 144, which permits passage of ions therethrough in accordance with a particular pattern, magnification mechanism 146, and deflection plates 148. The magnification mechanism 146 is preferably operable to either reduce the cross sectional region of the ion fluence or to form the ion fluence into an ion beam. FIG. 5 illustrates an embodiment of the mask 144 and magnification mechanism 146 forming a reduced pattern on the substrate 140.

In use, the operation of the apparatus 100 is similar to the operation of the apparatus 10 illustrated in FIGS. 1-3. The chamber 102 is evacuated to about $2 \times 10^{-6}$ torr after having placed the targets 121-123 and substrate 140 within the chamber. The laser beam 104 is split into three segments by the beam splitters 106 and mirrors 108, with the segments passing through the respective irises 110 and focused on the targets 121-123 by the lenses 112. Each iris 110 can be selectably operated to control the amount of laser energy arriving at each respective lens 112. Thus, operation of the respective iris 110 can control the laser ablation on the targets 121-123, which can control the laser ablation characteristics and concentration of material in the ablation plume.

Operation of the respective electronics 130-132 in turn controls the negative potential (in the range of about 200-2000 volts) reaching a respective accelerating grids 125, 126. In the illustrated embodiments, the accelerating grids 125, 127 are generally aligned to produce an ion fluence column linerally extending to the substrate 140. It should be appreciated that a magnetic field imposed perpendicular to the laser ablation plume may be useful in some versions for directing the ions into the ion fluence column.

In the illustrated configuration, targets 121-123 can be ablated simultaneously to produce an admixture of ions in the ion fluence column, or the irises 110 can be operated to sequentially ablate particular targets 121-123. For example, a first layer of diamond-like carbon might be produced and deposited on the substrate 140 by closing the irises 110 corresponding to the targets 121 and 122, leaving only laser ablation and ionization of graphite target 123. After the initial deposition of diamond-like carbon layer, the boron target 122 might be ablated simultaneously with the graphite target 123 to produce a boron doped layer of diamond-like carbon. Of course, the phosphorous layer 121 might similarly be selectively ablated to produce a layer of phosphorous doped diamond-like carbon, or a single layer of phosphorous. Such boron and phosphorous layers may be alternated to form n-p junctions to achieve semiconducting diamond-like carbon. Of course, a variety of other materials might be substituted for the targets 121-123.

The ion fluence column is advantageously controlled by the ion optics 142. For example, as illustrated in FIG. 5, a mask 144 is interposed in the ion fluence column to prevent passage of some ions while permitting passage of other ions in accordance with a particular pattern—in this case an "X" pattern. The ions transiting the mask 144 transit the magnifying mechanism 146 where the fluence column is reduced in cross-section to produce a magnified pattern complemental to the mask pattern on the substrate 140. Of course, a variety of masks 144 can be used or interchanged to pattern the material or create geometric forms for diverse applications. The mask 144, for example, might comprise a circuit stencil with the target 123 comprising semiconductor material and the targets 121 122 comprising a semiconductor dopant. A custom integrated circuit might thus be formed on a small production basis. Further, one of the targets 121-123 might comprise graphite for incorporating a diamond-like carbon protective and thermal conducting layer on the integrated circuit.

Still another variation of the ion optics 142 is to use the magnifying mechanism 146 and the deflection plates 148 to custom scribe a pattern on the substrate 140. That is, the magnifying mechanism 146 is used to focus the ion fluence into an ion beam. The focus ion beam is then manipulated by the deflection plates 148 into the desired pattern. The deflection plates 148 can manipulate the ion beam in a vector scan fashion to produce the desired pattern of the ion fluence onto the substrate 40. Alternatively, the deflection plates 148 can manipulate the ion beam in a raster scan pattern with the irises 110 and grids 125-127 operated to turn on and off the ion fluence as the ion beam continuously scans the substrate in a raster fashion.

A wide variety of other materials can be used in the apparatus 10 or 100 to produce a variety of different types of layers for diverse applications without departing from the scope of the present invention as defined by the claims.

What is claimed is:

1. An apparatus for producing a layer of material comprising:
   laser means selectably operable for directing a laser beam along a first path of travel;
   a chamber;
   means for creating a vacuum within said chamber;
   means for holding a target material at a target location within the chamber generally along the first path of travel;
   focusing means disposed along said first path of travel for focusing the laser beam at the target location to eject and ionize a portion of the target material;
   electrode means disposed within the chamber and chargeable at an electrical potential and positioned adjacent ions and trailing free electrons for separating and moving said ions and electrons from the target location along a second path of travel within the chamber; and
   means for supporting a substrate disposed along the second path of travel with the chamber for collecting ions and trailing free electrons on the substrate to produce a layer of material on the substrate.

2. The apparatus according to claim 1, wherein the chamber includes a window and the laser is positioned outside the chamber with said first path of travel traversing the window.

3. The apparatus according to claim 1, said electrode means comprising a grid positioned along the second path of travel between and separate from the target holding means and substrate support means.

4. The apparatus according to claim 3, the grid being chargeable at a negative potential in the range of about 200-2000 volt.

5. The apparatus according to claim 3, including means positioned between said grid and substrate support means to isolate the second path of travel from external electrical fields.

6. The apparatus according to claim 1, said target material consisting essentially of graphite for producing carbon ions and a diamond-like carbon layer, said diamond-like carbon layer having less than 20% hydrogen concentration.

7. The apparatus according to claim 1, said target holding means including a bracket for engaging the target and a motor coupled to the bracket for selectably moving the target.

8. The apparatus according to claim 1, said focusing means comprising a lens positioned in the chamber about 12 centimeters from the target and having about a 12 centimeter focal length.

9. The apparatus according to claim 1, said vacuum creating means being operable for creating a vacuum within the chamber up to about $2 \times 10^{-6}$ torr.

10. The apparatus according to claim 1, including means for directing a second laser beam along a third path of travel and another target holding means within the chamber generally located along the third path of travel.

11. The apparatus according to claim 1, including a mask disposed along the second path of travel for preventing part of the ions from reaching the substrate to produce the layer in a pattern corresponding to the mask.

12. The apparatus according to claim 1, the laser means being operable for producing a power density on the target greater than about $1 \times 10^9$ watt/cm$^2$.

13. The apparatus according to claim 1, said target material consisting essentially of graphite for producing carbon ions and a diamond-like carbon layer, said diamond-like carbon layer having a hydrogen-to-carbon ration less than 30%.

14. The apparatus according to claim 1, said target material consisting essentially of graphite for producing carbon ions and a diamond-like carbon layer, said diamond-like carbon layer having a hydrogen-to-carbon ration less than 20%.

15. An apparatus for producing a layer of diamond-like carbon on a substrate, comprising:
   a chamber having a window;
   means for creating a vacuum within the chamber;
   a laser disposed and selectably operable for directing a laser beam through the window into the chamber along a laser beam path of travel;
   a graphite target disposed within the chamber;
   lens means positioned along the laser beam path of travel to focus the beam on the graphite target,
      for ejecting a plume of carbon vapor from the target, and
      for ionizing a portion of the plume to create carbon ions;
   an accelerating grid disposed within the chamber and spaced from the graphite target, the grid being chargeable to a negative potential for separating the carbon ions with trailing free electrons from the plume and for moving the carbon ions and trailing free electrons along an ion path of travel from the target through the grid;
   a substrate disposed within the chamber along the ion path of travel, with the grid between and separate from the substrate and graphite target, for collecting the carbon ions for form a layer of diamond-like carbon on the substrate.

16. The apparatus according to claim 15, including:
   a target of dopant material disposed within the chamber; and
   means for selectably directing a laser beam at the dopant target for creating dopant ions,
   the dopant target being disposed for transport of the dopant ions along the ion path of travel to collect dopant ions on the substrate.

17. A method for producing a layer of material comprising the steps of:
   positioning a first target of first material in a chamber;
   creating a vacuum within the chamber enveloping the first target;
   directing a laser beam at the first target;

focusing the laser beam on the first target;
ablating a portion of the first target with the laser beam focused on the target to eject a plume of the first target material;
ionizing part of the plume with the laser beam impacting the plume to create ions and trailing free electrons in the region of the plume;
moving at least some of the ions and trailing free electrons from the region towards a charged potential within the chamber along an ion path of travel;
positioning a substrate along the ion path of travel; and
collecting the ions and trailing free electrons on the substrate to form a layer of material on the substrate.

18. The method according to claim 17, including positioning a laser outside the chamber and directing the laser beam through a window in the chamber at the first target.

19. The method according to claim 17, the focusing step including positioning a lens within the chamber.

20. The method according to claim 17, including the step of rotating the first target periodically to ablate the first target at a plurality of locations.

21. The method according to claim 17, including the step of positioning the charged potential at a spaced location between the first target and substrate.

22. The method according to claim 21, including the step of isolating the ions traveling between the potential and substrate from extraneous electrical fields.

23. The method according to claim 21, including the step of imposing another electrical field along the ion path and between the potential and substrate to adjust the energy of the ions impinging the substrate.

24. The method according to claim 17, the first target material comprising graphite, the ion comprising carbon ions, and the layer comprising diamond-like carbon having less than 20% hydrogen concentration.

25. The method according to claim 24, the substrate comprising silicon.

26. The method according to claim 24, the diamond-like carbon layer having a generally uniform thickness and a surface roughness less than about 10 Angstroms.

27. The method according to claim 24, the diamond-like carbon layer having an index of refraction within the range of about 1.5-2.5.

28. The method according to claim 24, the diamond-like carbon layer having a resistivity greater than about 40 mega ohms per centimeter.

29. The method according to claim 17, including the steps of positioning a second target of a second material within the chamber, directing a laser beam at both targets, and focusing the laser beam on both the first and second targets.

30. The method according to claim 29, wherein a laser beam is directed and focused simultaneously on the first and second targets in the chamber.

31. The method according to claim 29, including selectively and sequentially directing and focusing a laser beam at the first and second targets in the chamber.

32. The method according to claim 29, the directing step including the substeps of operating a single laser and separating the beam to direct a portion of the beam at each target.

33. The method according to claim 29, the directing step including the substeps of operating two lasers to direct a beam at the first and second targets respectively.

34. The method according to claim 33, said operating substep including operating each laser independently to achieve a desired power density for each target.

35. The method according to claim 29, the directing step including the substeps of positioning an iris along the separate beam path of travel and operating each iris to selectively ablate the respective targets.

36. The method according to claim 17 or 29, including the steps of positioning a mask along the ion path of travel prior to the substrate and masking a portion of the ions to form a desired pattern of the material on the substrate.

37. The method according to claim 36, including the steps of positioning ion optics between the mask and substrate and magnifying the ions emerging from the mask onto the substrate.

38. The method according to claim 17 or 29, including the steps of positioning ion optics along the ion path of travel, focusing the ion fluence, and directing the focused ions selectively onto the substrate.

39. The method according to claim 38, the directing step including the substeps of positioning deflection plate along the ion path of travel between the ion optics and substrate, and deflecting the focused ion fluence in a desired pattern on the substrate.

40. The method according to claim 39, the deflecting substep including scanning a raster pattern on the substrate and selectively producing ions for travel along the ion path of travel.

41. The method according to claim 39, the deflecting substep including producing a vector scan of the substrate in a desired pattern.

42. The method according to claim 29, the first target comprising graphite for producing diamond-like carbon the second target comprising a dopant for selectively doping the layer.

43. The method according to claim 42, the dopant comprising boron.

44. The method according to claim 17, the first target comprising graphite, the ions comprising carbon ions, and the layer comprising diamond-like carbon having a hydrogen-to-carbon ratio less than 30%.

45. The method according to claim 44, the layer comprising diamond-like carbon having a hydrogen-to-carbon ratio less than 20%.

46. An apparatus for producing a layer of material on a substrate comprising:
a chamber;
means for producing a vacuum within the chamber;
first and second targets positioned within the chamber;
means for producing a laser beam;
means disposed relative to the first and second targets for directing a laser beam on each target to eject material and ionize at least a portion of the material;
separation means disposed within the chamber and chargeable at an electrical potential for separating ions from the ejected material and for moving the ions and trailing free electrons along an ion path of travel from the targets;
a substrate disposed within the chamber along the ion path of travel for collecting the ions to form a layer of material on the substrate.

47. The apparatus according to claim 46, the directing means including a beam splitter for splitting a single beam into two beams.

48. The apparatus according to claim 46, the directing means including a lens disposed for focusing each laser beam on each respective target.

49. The apparatus according to claim 46, the directing means including an iris disposed in the path of travel of each laser beam to selectively lase each target.

50. The apparatus according to claim 46, the beam producing means including first and second lasers directed at the first and second targets respectively.

51. The apparatus according to claim 46, the beam producing means being operable to produce a laser beam on each target at a power density greater than about $1 \times 10^6$ watt/cm$^2$.

52. The apparatus according to claim 46, the vacuum means being operable to evacuate the chamber to about $2 \times 10^{-6}$ torr.

53. The apparatus according to claim 46, the separation means comprising a grid chargeable at a negative potential in the range of about 200–2000 volts.

54. The apparatus according to claim 46, the separation means comprising a pair of grids disposed respectively adjacent each target.

55. The apparatus aocording to claim 54, both grids being linerally aligned in the ion path of travel.

56. The apparatus according to claim 54, the grids being selectively operable to charge only one grid.

57. The apparatus according to claim 46, including ion optic means disposed along the ion path of travel for directing the impingement of the ions on the substrate.

58. The apparatus according to claim 57, the ion optics means comprising a mask for preventing some of the ions from reaching the substrate.

59. The apparatus according to claim 56, including means for magnifying the ion fluence between the mask and substrate to produce a pattern of reduced size complemental to the mask pattern.

60. The apparatus according to claim 57, the ion optics including means for magnifying the ion fluence into an ion beam.

61. The apparatus according to claim 60, including deflection plates to deflect the ion beam into a desired pattern on the substrate.

62. The apparatus according to claim 61, the deflection plates being operable in a raster scan.

63. The apparatus according to claim 61, the deflection plates being operable in a vector scan.

* * * * *

UNITED STATES PATENT AND TRADEMARK OFFICE
CERTIFICATE OF CORRECTION

PATENT NO. : 4,987,007

DATED : January 22, 1991

INVENTOR(S) : S. Wagal and C. Collins

It is certified that error appears in the above-identified patent and that said Letters Patent is hereby corrected as shown below:

Col. 9, Claim 1, line 40, delete the word "with" and substitute the word --within--.

Col. 10, Claim 13, line 23, delete the word "ration" and substitute the word --ratio--.

Col. 10, Claim 14, line 28, delete the word "ration" and substitute the word --ratio--.

Col. 10, Claim 15, line 53, delete the word "for" and substitute the word --to--.

Col. 11, Claim 24, line 37, delete the word "ion" and substitute the word --ions--.

Col. 14, Claim 59, line 11, delete the number "56" and substitute the number --58--.

Signed and Sealed this

Fourteenth Day of July, 1992

*Attest:*

DOUGLAS B. COMER

*Attesting Officer*     *Acting Commissioner of Patents and Trademarks*